(12) United States Patent
Kwon et al.

(10) Patent No.: US 8,114,701 B2
(45) Date of Patent: Feb. 14, 2012

(54) CAMERA MODULES AND METHODS OF FABRICATING THE SAME

(75) Inventors: Woon-Seong Kwon, Seoul (KR); Tae-Je Cho, Gyeonggi-do (KR); Yong-Hwan Kwon, Gyeonggi-do (KR); Un-Byoung Kang, Gyeonggi-do (KR); Chung-Sun Lee, Gyeonggi-do (KR); Hyung-Sun Jang, Gyeonggi-do (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 277 days.

(21) Appl. No.: 12/274,642

(22) Filed: Nov. 20, 2008

(65) Prior Publication Data
US 2009/0130791 A1 May 21, 2009

(30) Foreign Application Priority Data
Nov. 20, 2007 (KR) .................. 10-2007-0118523

(51) Int. Cl.
*H01L 21/00* (2006.01)
(52) U.S. Cl. .................. 438/68; 438/110
(58) Field of Classification Search .............. 438/110, 438/113–114, 116, 121, 123, 57–98
See application file for complete search history.

(56) References Cited

U.S. PATENT DOCUMENTS

| | | | |
|---|---|---|---|
| 6,790,694 B2 * | 9/2004 | Sugiyama et al. ............. | 438/33 |
| 2006/0044450 A1 | 3/2006 | Wolterink et al. | |
| 2006/0076580 A1 * | 4/2006 | Yaung et al. .................. | 257/213 |
| 2006/0079024 A1 * | 4/2006 | Akram ........................... | 438/110 |
| 2007/0126912 A1 * | 6/2007 | De Bruin et al. ............. | 348/340 |
| 2008/0002460 A1 * | 1/2008 | Tuckerman et al. .......... | 365/158 |
| 2008/0061407 A1 * | 3/2008 | Yang et al. .................... | 257/660 |
| 2008/0164550 A1 * | 7/2008 | Chen et al. .................... | 257/432 |

FOREIGN PATENT DOCUMENTS

| | | |
|---|---|---|
| JP | 2004-229167 | 12/2004 |
| JP | 2007-129164 | 5/2007 |

OTHER PUBLICATIONS

English language abstract of Japanese Publication No. 2007-129164.

* cited by examiner

*Primary Examiner* — Charles Garber
*Assistant Examiner* — Calvin Choi
(74) *Attorney, Agent, or Firm* — Muir Patent Consulting, PLLC

(57) ABSTRACT

Provided are camera modules capable of effectively shielding electromagnetic (EM) waves and methods of fabricating the same. A method of fabricating a camera module includes, preparing a first wafer including an array of lens units. Then, a second wafer including an array of image sensor CSPs (chip-scale packages) is prepared. Each of the image sensor CSPs includes an image sensor chip corresponding to one of the lens units. The first wafer is stacked on the second wafer. The first wafer and the second wafer are cut to form a trench exposing the top surface of the image sensor chip at the interface between adjacent lens units. The trench is filled with a first material used for forming a housing. The first material and the image sensor chip are cut at the interface between the adjacent lens units.

20 Claims, 5 Drawing Sheets

CAMERA MODULES AND METHODS OF FABRICATING THE SAME

CROSS-REFERENCE TO RELATED PATENT APPLICATION

This application claims the benefit of Korean Patent Application No. 10-2007-0118523, filed on Nov. 20, 2007, in the Korean Intellectual Property Office, the disclosure of which is incorporated herein in its entirety by reference.

BACKGROUND

The present inventive concept relates to camera modules and methods of fabricating the same, and more particularly, to camera modules including housings capable of effectively shielding electromagnetic (EM) waves, and methods of fabricating the same.

FIG. 1 is an exploded perspective view of a conventional camera module, and FIG. 2 is a cross-sectional view of the assembled camera module shown in FIG. 1.

Referring to FIGS. 1 and 2, the camera module may include a lens group 10, a lens container 20, a housing 30, and an image sensor 40. The lens group 10 may include at least one lens 12 arranged in the direction of an optical axis X and be contained in the lens container 20.

The lens container 20 may be a containing member with a predetermined size. The container member may include an incidence hole 24 with a predetermined size, which is formed in the center of a front surface of the lens container 20 and has a center disposed about the optical axis X. Also, the lenses 12 of the lens group 10 may be arranged about the optical axis X. In this case, the lens container 20 may include a hollow cylindrical barrel 21 and a cap 23. The hollow cylindrical barrel 21 includes a positive screw unit 21*a*, which is disposed in an outer surface of the hollow cylindrical barrel 21 and helically fastened with a negative screw unit 31*a* formed in an assembling hole 31 of the housing 30. The lens group 10 is arranged in the body of the hollow cylindrical barrel 21 about the optical axis X. The cap 23 includes the incidence hole 24 (which is disposed in the center of the front surface of the cap 23) and is helically fastened with an inner surface of the barrel 21 to fix the lens group 10. When the cap 23 is helically fastened with the top end of the barrel 21, a projection 25 by which the lowermost end is caught may protrude from the bottom end of the barrel 21. Although FIG. 2 illustrates the cap 23 with an assembling structure helically fastened with the top end of the barrel 21, the cap 23 may have an alternative assembling structure.

The housing 30 includes a body 33 through which the assembling hole 31 is formed to contain the lens container 20 in the housing 30. The housing 30 is mounted on the top surface of a substrate 45. The assembling hole 31 may include the negative screw unit 31*a* helically fastened with the positive screw unit 21*a* formed in the barrel 21, such that the lens container 20 is assembled in the housing 30 while moving about the optical axis X. Also, the housing 30 may be mounted on the top surface of the substrate 45 with an adhesive 32, such as epoxy resin. In this case, the adhesive 32 used for fixing the housing 30 to the substrate 45 may be a conductive adhesive, such as anisotropic conductive paste (ACP) or an anisotropic conductive film (ACF).

Meanwhile, various circuit patterns may be printed on the substrate 45. The image sensor 40 may be mounted on one side of the substrate 45, while a connector (not shown) for easily connecting the camera module with other electronic components may be disposed on the other side thereof. The image sensor 40 may be a sensing member, which includes an image region 40*a* disposed on the top surface thereof. Light passing through the lens group 10 of the lens container 20 is irradiated to the image region 40*a* to form an image. The image sensor 40 is electrically connected to the substrate 45 so that the image sensor 40 may convert the formed image into an electric signal and transmit the electric signal to a display unit. The substrate 45 may be a flexible printed circuit board (FPCB) with a relatively small thickness or other ordinary PCB. As shown in FIGS. 1 and 2, when the image sensor 40 is mounted on the substrate 45, a plurality of bonding pads 47*a* formed on the substrate 45 may be electrically connected to a plurality of bonding pads 47*b* formed on the image sensor 40 by means of a wire bonding technique using metal wires 47. Also, an optical filter member 50 functioning as an infrared (IR) cut-off filter may be mounted between the lens group 10 and the image sensor 40.

The above-described conventional camera module is fabricated as separated components, such as the lenses 12, the image sensor 40, and the housing 30. Thus, downscaling the camera module is difficult and fabricating the camera module becomes increasingly expensive.

Forming a housing using a conductive material has been required more and more in order to shield electromagnetic (EM) waves. Due to the increasing usage of digital electronic components and their ever-increasing clock frequencies, EM waves may give rise to various disadvantages, such as interference between channels of a wireless communication system, thereby deteriorating the utility of spectra and the reliability of information and communication networks. Furthermore, the EM waves may greatly affect an ecosystem including the human body. In other words, more attention must be paid to the electromagnetic compatibility (EMC) of electronic components. The EMC may be classified into electromagnetic interference (EMI) and electromagnetic susceptibility (EMS). EMI refers to a phenomenon where radio-frequency (RF) energy and noise radiated from a product detrimentally affects other adjacent products. Conversely, EMS refers to a phenomenon where a product has a tolerance to all RF energy and noise radiated from other adjacent products that effect normal operations of the product. Hereinafter, the term "to shield EM waves" will carry the meaning of to minimize EMI and maximize EMS.

In order to fabricate the camera module shown in FIGS. 1 and 2, the housing 30 is formed as an independent component and combined with a package structure including the image sensor 40. In this case, the housing 30 is highly likely to be sensitive to dimensional variance such that dimensional variance may degrade an EMI-resistant characteristic of the camera module. In addition, a complicated epoxy process should be performed to combine the housing 30, which is formed of a conductive material, with the package structure including the image sensor 40.

SUMMARY

The embodiments of the present inventive concept provides a camera module including a housing capable of effectively shielding electromagnetic (EM) waves.

Also, embodiments of the present inventive concept provides a method of fabricating a camera module in which a housing capable of effectively shielding EM waves can be effectively formed.

According to an aspect of the embodiments of the present inventive concept, there is provided a camera module including: a lens unit including at least one lens; an image sensor chip-scale package (CSP) including an image sensor with an image region that is irradiated with light passing through the lens unit to form an image; and a housing bonded to a top surface of the image sensor chip and formed of a conductive material, wherein a ground pad is further disposed on the top surface of the image sensor chip, and the housing is in contact with the ground pad.

The camera module may further include a spacer disposed between the lens unit and the image sensor CSP to maintain a focal distance between the lens unit and the image sensor chip.

The image sensor CSP may further include a cover glass layer disposed on the top surface of the image sensor chip, the ground pad may be disposed on the top surface of the image sensor chip exposed by the cover glass layer, and a lateral surface of the housing may form a coplanar surface with a lateral surface of the image sensor chip.

According to another aspect of embodiments of the present inventive concept, there is provided a method of fabricating a camera module. The method includes preparing a first wafer including an array of lens units. A second wafer including an array of image sensor CSPs is prepared. Each of the image sensor CSPs includes an image sensor chip corresponding to one of the lens units. The first wafer is stacked on the second wafer. The first wafer and the second wafer are cut to form a trench exposing a top surface of the image sensor chip at an interface between adjacent lens units. The trench is filled with a first material used for forming a housing. The first material and the image sensor chip are cut at the interface between the adjacent lens units.

Preparing the first wafer may include forming a spacer pattern on a bottom surface of the first wafer to maintain a focal distance between the lens unit and the image sensor chip.

Preparing the second wafer may include forming a cover glass layer on the top surface of the image sensor chip. The image sensor chip may have a connection structure using a through via. Preparing the second wafer may include forming a ground pad on the top surface of the image sensor chip.

The first and second wafers may be cut to form the trench exposing the ground pad formed on the top surface of the image sensor chip.

During the filling of the trench with the first material, the first material may extend to an outer portion of the lens unit by which light is cut off so as to form an aperture in the lens unit. The first material may include at least one of a conductive material and a light blocking material. The trench may be filled with the first material a dispensing process or a molding process. Alternatively, the trench may be filled with the first material is performed using a chemical vapor deposition (CVD) process or a physical vapor deposition (PVD) process.

The first material and the image sensor chip may be cut on an interface between adjacent ground pads. The first and second wafers may be cut using a first cutting blade with a first width such that the trench is formed to have the first width.

The first material and the image sensor chip may be cut using a second cutting blade, a laser, or a water-jet, which has a second width smaller than the first width.

BRIEF DESCRIPTION OF THE DRAWINGS

The above and other aspects of embodiments of the present inventive concept will become more apparent by describing in detail exemplary embodiments thereof with reference to the attached drawings in which.

DETAILED DESCRIPTION OF THE EMBODIMENTS

Figure 1:
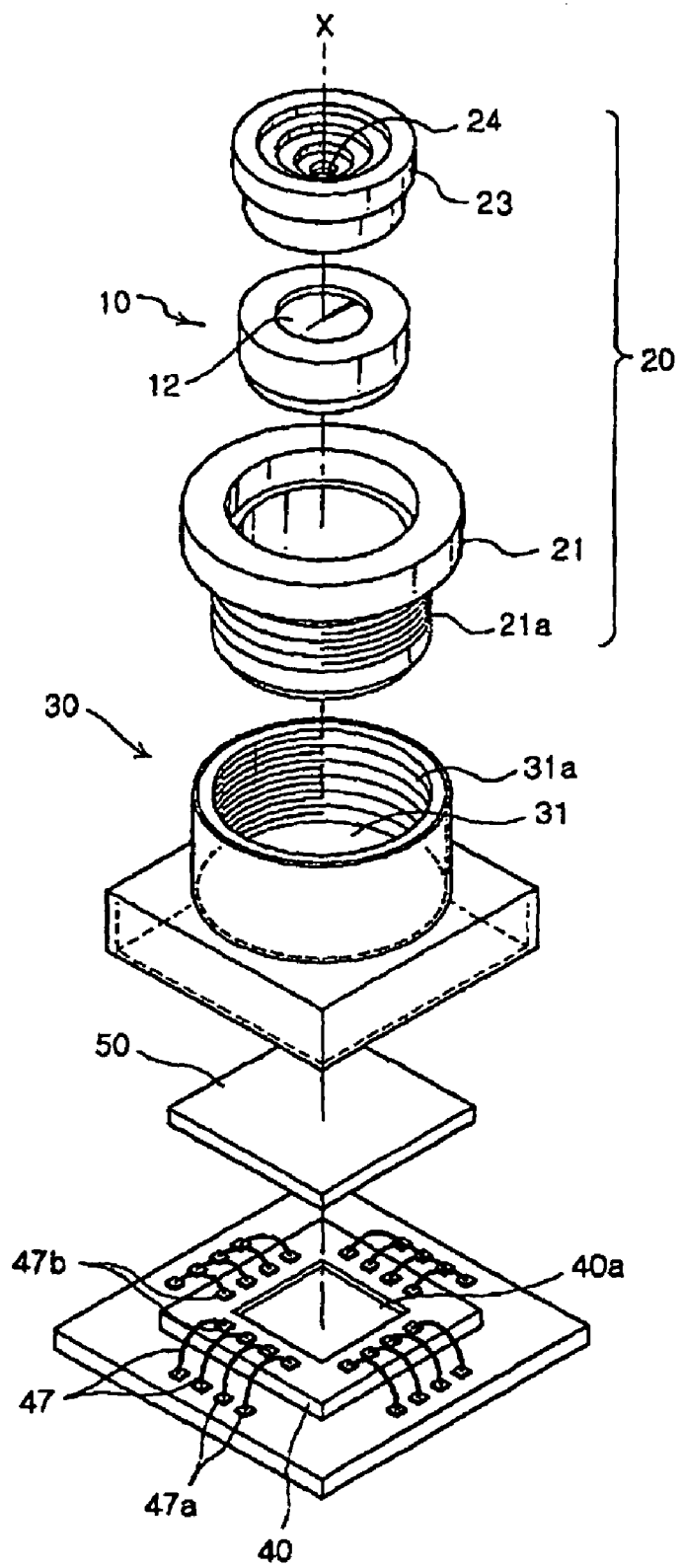
FIG. 1 is an exploded perspective view of a conventional camera module.

The present inventive concept will now be described more fully hereinafter with reference to the accompanying drawings, in which exemplary embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the thicknesses of layers and regions are exaggerated for clarity. Like numbers refer to like elements throughout.

Spatially relative terms, such as "beneath", "below", "lower", "above", "upper," and the like, may be used herein for ease of description to describe the relationship of one element or feature to one or more other elements or features as illustrated in the figures. It will be understood that such spatially relative terms are intended to encompass different orientations of the device in use or operation in addition to the orientation depicted in the figures. For example, if the device in the figures is turned over, an element described as "below" or "beneath" other elements or features would then be oriented "above" the other elements or features. Thus, the exemplary term "below" describes an orientation relative to other elements, not relative to an absolute direction. Whatever the absolute orientation of the device may be, the interpretation of spatially relative descriptors used herein should be adjusted accordingly FIG. 3 is a cross-sectional view of a camera module according to an embodiment of the present inventive concept.

Figure 3:
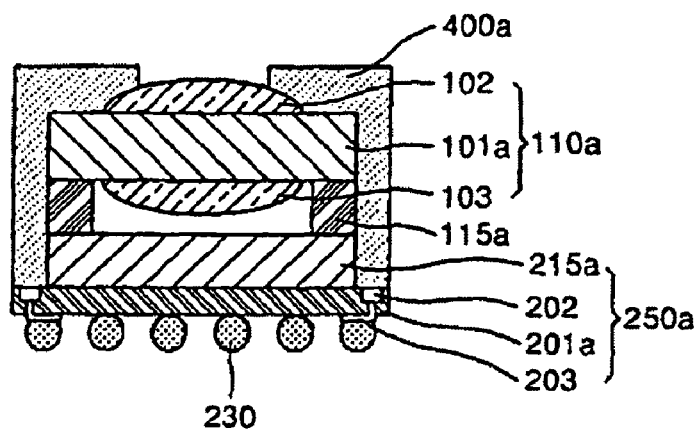
FIG. 3 is a cross-sectional view of a camera module according to an embodiment of the present inventive concept.

Referring to FIG. 3, the camera module according to the embodiment of the present inventive concept may include a lens unit 110a having a least one lens; for example, first and second lenses 102 and 103. The first and second lenses 102 and 103 may be spherical or aspherical lenses formed of a transparent material, such as glass. The first and second lenses 102 and 103 may collect or refract light radiated from an object to form an optical image. The camera module may include a larger number of lenses than the two lenses 102 and 103. The lenses 102 and 103 may be provided on a surface of a glass substrate 101 a as shown in FIG. 3. Each of the lenses 102 and 103 may be fixed in a barrel (not shown).

The lenses 102 and 103 may be plastic lenses or glass lenses. Plastic lenses, possibly obtained by injection molding, may be produced in large quantities at low cost to be suitable for widespread use. In comparison, although glass lenses may satisfy appropriate conditions for megapixel resolutions, the fabrication of glass lenses may involve complicated cutting and polishing processes and may preclude the creation of lenses other than spherical or planar lenses.

Figure 2:
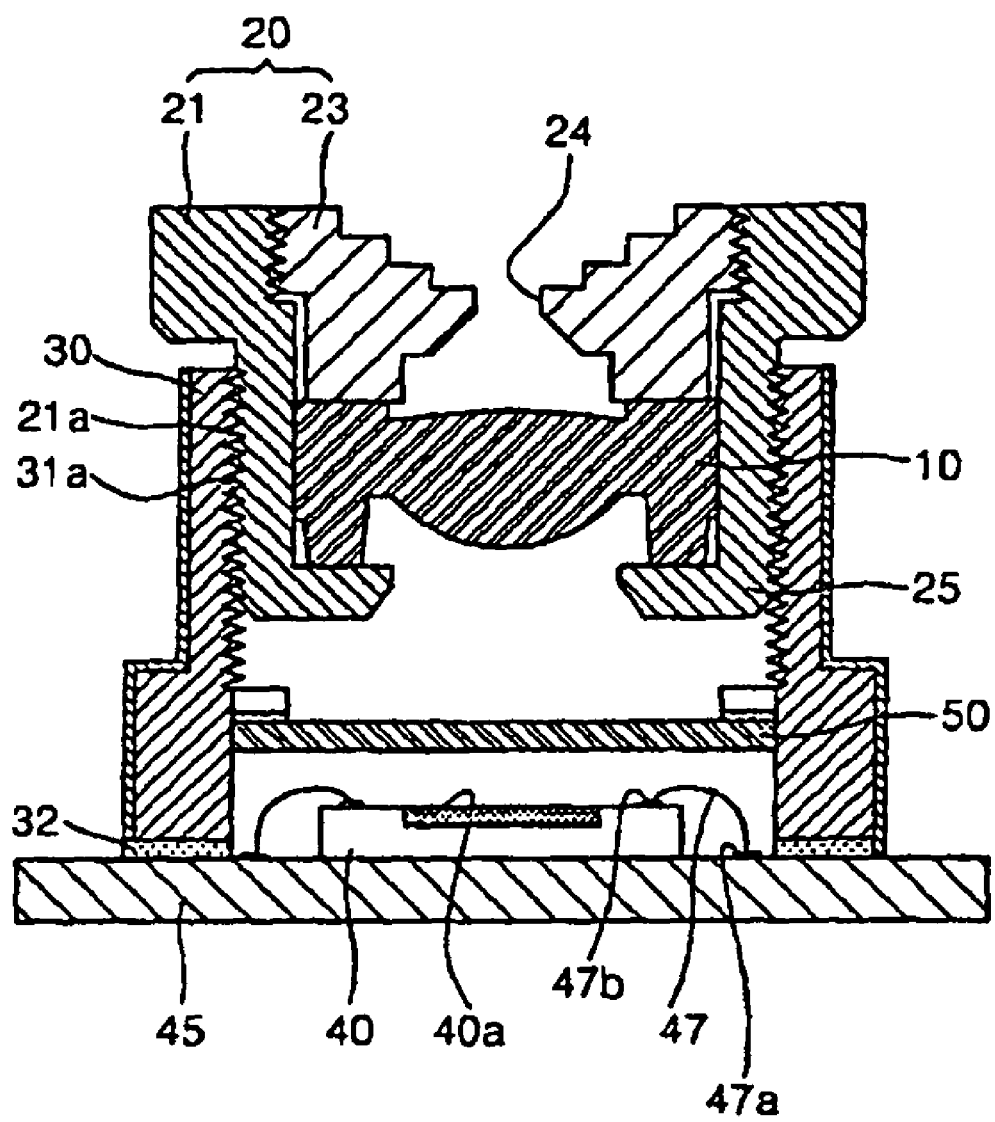
FIG. 2 is a cross-sectional view of the assembled conventional camera module shown in FIG. 1.

Since the lens unit 110a may have various combined structures according to the characteristics of the camera module, embodiments of the present inventive concept will be described with reference to schematic views of the lens unit 110a. For example, the combination of the lens unit 110a may be the same as shown in FIGS. 1 and 2, but the present inventive concept is not limited thereto.

The camera module according to the embodiment of the present inventive concept may include an image sensor chip-scale package or chip-size package (image sensor CSP) 250a having an image sensor chip 201a. The image sensor chip 201a may include an image region, which may be irradiated with light passing through the lens unit 110a to form an image. The image sensor chip 201a may receive light and may convert the light into an electric signal. The image sensor chip 201a may be categorized as either a charge-coupled device (CCD) sensor chip or a complementary metal-oxide-semiconductor (CMOS) sensor chip depending upon the chosen operation and fabrication method.

Light incident on lenses may be focused on a CCD sensor chip that is based on an analog circuit. Each of a plurality of cells in the CCD sensor chip may store charge corresponding to the incident light, may determine light intensity based on the stored charge amount, and may transmit an electric signal to a converter to create color. The CCD sensor chip may be capable of high resolution, but it may require mass data storage and may consume high power. CCD sensor chips are widely used in high-resolution digital cameras.

A CMOS sensor chip may be fabricated by integrating an analog signal processing circuit and a digital signal processing circuit in a semiconductor device. The CMOS sensor chip may consume around one-tenth of the power consumed by a CCD sensor chip. Also, as the CMOS sensor chip may be comprised of a single chip, it may be more appropriate for compact products. In recent years, with improvements in technologies, CMOS sensor chips have become capable of high resolution in addition to the above-described merits. As a result, CMOS sensor chips have become the leading image sensor in various fields, such as digital cameras, camera phones, and personal medial players (PMPs).

Chip-scale packaging has recently been proposed and developed. One aspect of CSPs in comparison with conventional plastic packages is reduced package size. According to the definition of international semiconductor associations, such as the Joint Electron Device Engineering Council (JEDEC) and the Electronic Industry Association of Japan (EIAJ), a CSP has a package size of 1.2 times the size of the chip or less.

CSPs are principally employed for compact, mobile products, such as digital camcorders, portable phones, notebook computers, and memory cards. Also, semiconductor devices, such as digital signal processors (DSPs), application specific integrated circuits (ASICs), and micro controllers, are mounted in CSPs. Additional uses for CSPs, including use in memory devices such as dynamic random access memories (DRAMs) and in flash memories, are being developed.

A cover glass layer 215a may be formed on the top surface of the image sensor chip 201a. The image sensor chip 201a may have a connection structure using a through via. In other words, an internal electrical connection structure may be formed from the top surface of the image sensor chip 201a to the bottom surface thereof. A ground pad 202 may be formed on the top surface of the image sensor chip 201a. A conductive ball 230 may be formed on the bottom surface of the image sensor chip 201a. The conductive ball 230 may be a solder ball. An interconnection pattern 203 formed in the image sensor chip 201a may electrically connect the ground pad 202 and the conductive ball 230.

The cover glass layer 215a may have a smaller width than the image sensor chip 201a so as to expose the ground pad 202 formed on the top surface of the image sensor chip 201a.

The camera module according to the embodiment of the present inventive concept may include a housing 400a which is formed of a conductive material and which is bonded to the top surface of the image sensor chip 201a. The conductive material may contain at least one element selected from a group comprising nickel (Ni), tin (Sn), copper (Cu), gold (Au), and silver (Ag). The housing 400a may enclose the lateral surface of the lens unit 110a and may be bonded to the top surface of the image sensor chip 201a. In this case, the housing 400a may be in contact with the ground pad 202 formed on the top surface of the image sensor chip 201a. The housing 400a may extend to the top surface of the lens unit 110a, more specifically, to the outer portion of the lens unit 110a by which light is cut off to form an aperture. The lateral surface of the housing 400a may form a coplanar surface with the lateral surface of the image sensor chip 201a.

The conductive ball 230 formed on the bottom surface of the image sensor chip 201a may be electrically connected to a main substrate (not shown). The main substrate may be a printed wire board (PWB), a flexible PWB, or a rigid flexible PWB.

A spacer 115a may be formed between the lens unit 110a and the image sensor CSP 250a in order to maintain a focal distance between the lens unit 110a and the image sensor chip 201a. The spacer 115a may be formed of silicon or glass.

FIGS. 4A through 4F are cross-sectional views illustrating a method of fabricating a camera module according to an embodiment of the present inventive concept.

Figure 4A:
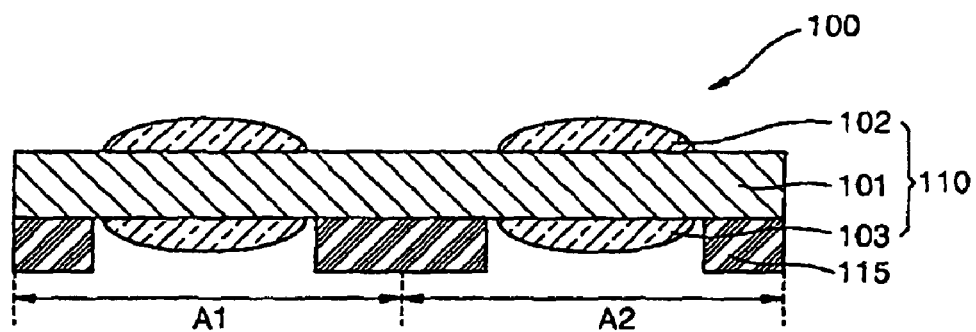
FIGS. 4A through 4F are cross-sectional views illustrating a method of fabricating a camera module according to an embodiment of the present inventive concept.

Referring to FIG. 4A, a first wafer 100 including an array of lens units 110 may be prepared. That is, a plurality of lens units 110, in which each lens unit 110 includes lenses 102 and 103, are arranged on surfaces of the substrate 101 of the first wafer 100 to form an array. Although FIG. 4A illustrates an array formed by a first structure A1 and a second structure A2, it is apparent to one of ordinary skill that a larger number of structures may be arranged on the first wafer 100 to form the array. The substrate 101 may be formed of glass.

A spacer pattern 115 may be formed on the bottom surface of the first wafer 100. The spacer pattern 115 is adapted to maintain a focal distance between the lens unit 110 and a subsequent image sensor chip. Thus, the focal distance between the lens unit 110 and the image sensor chip may be determined by controlling the height of the spacer pattern 115. The spacer pattern 115 may be formed of glass or silicon.

Figure 4B:
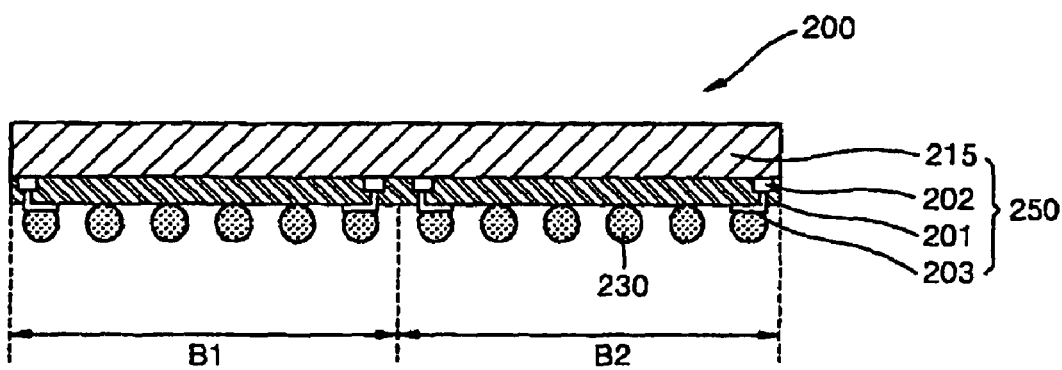

Referring to FIG. 4B, a second wafer 200 including an array of image sensor CSPs 250 may be prepared. That is, a plurality of image sensor CSPs 250, in which each image sensor CSP 250 may include an image sensor chip 201 corresponding to one of the lens units 110, may be arranged on the second wafer 200. A cover glass layer 215 may be formed on the top surface of the image sensor chip 201.

The image sensor chip 201 may have a connection structure using a through via. In other words, an internal electrical connection structure may be formed from the top surface of the image sensor chip 201 to the bottom surface thereof. A ground pad 202 may be formed on the top surface of the image sensor chip 201. A conductive ball 230 may be formed on the bottom surface of the image sensor chip 201. The conductive ball 230 may be a solder ball. An interconnection pattern 203 formed in the image sensor chip 201 may electrically connect the ground pad 202 and the conductive ball 230.

Third and fourth structures B1 and B2, each structure including the cover glass layer 215 formed on the image sensor chip 201 having the conductive ground pad 202 are formed on the second wafer 200 to form an array. Although FIG. 4B illustrates an array formed by the third and fourth structures B1 and B2, it is apparent to one of ordinary skill that a larger number of structures may be arranged on the second wafer 200 to form the array. The first structure A1 of the lens unit 110 may correspond to the third structure B1 of the plurality of image sensor CSPs 250, and the second structure A2 of the lens unit 110 may correspond to the fourth structure B2 of the plurality of image sensor CSPs 250.

Figure 4C:
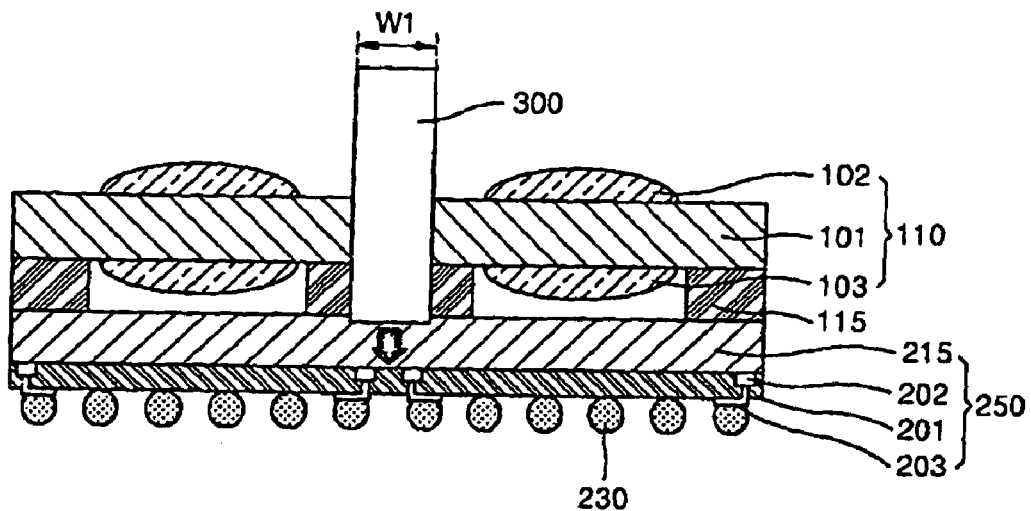

Referring to FIG. 4C, the first wafer 100 may be stacked on the second wafer 200. Thereafter, a first cutting process may be performed on the first and second wafers 100 and 200, thereby forming a trench (refer to T in FIG. 4D) to expose the top surface of the image sensor chip 201 at the interface between adjacent lens units 110. The first cutting process may be performed until the ground pad 202 formed on the top surface of the image sensor chip 201 is exposed to form the trench T. In this case, the first and second wafers 100 and 200 may be cut using a first cutting blade 300 with a first width W1 so as to form the trench T with the first width W1. Specifically, the substrate 101 of the first wafer 100, the spacer pattern 115, and the cover glass layer 215 of the second wafer 200 may be sequentially cut by the first cutting blade 300 with the first width W1 to expose the ground pad 202 formed on the top surface of the image sensor chip 201.

Figure 4D:
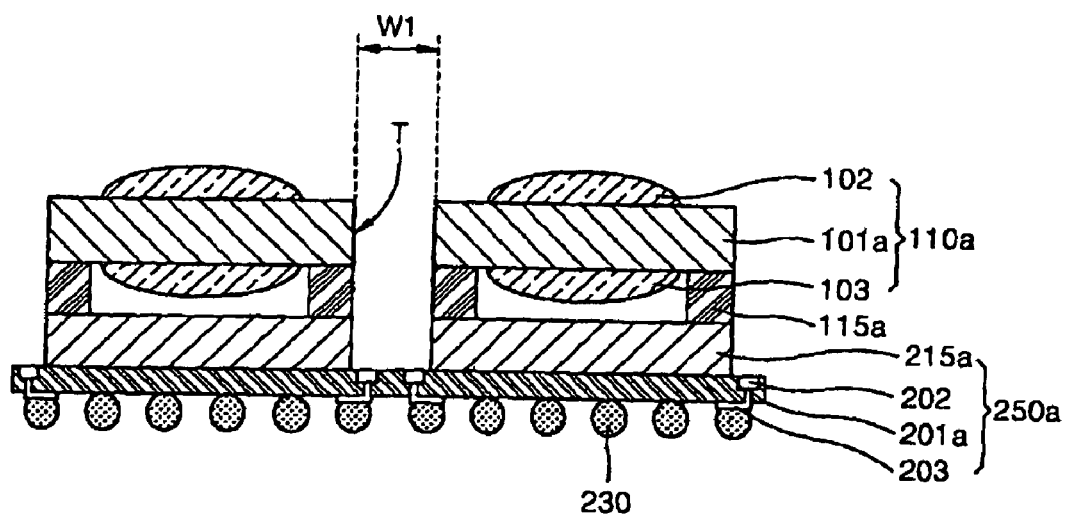

Referring to FIG. 4D, when the trench T is formed to have the first width W1, a substrate 101a, a lens unit 110a, an image sensor chip 201a, a spacer pattern 115a, a cover glass layer 215a, and an image sensor CSP 250a may be separately formed.

Figure 4E:
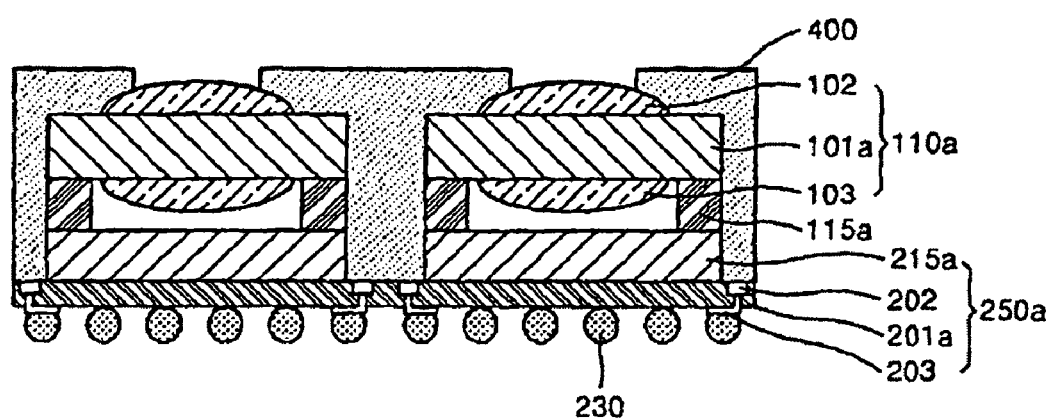

Referring to FIG. 4E, the trench T may be filled with a first material 400. The first material 400 may be a material used for forming a housing of the camera module. In order to shield EM waves, the first material 400 may include a conductive material, a light blocking material, or both. The first material 400 may be filled in the trench T using a dispensing method or a molding method. However, the present inventive concept is not limited thereto and the first material 400 may be filled in the trench T using other methods, for example, a chemical vapor deposition (CVD) technique or a physical vapor deposition (PVD) technique. Here, the conductive material may contain at least one Group 1 element selected from the group consisting of nickel (Ni), tin (Sn), copper (Cu), gold (Au), and silver (Ag). The first material 400 may extend to an outer portion of the lens 110a by which light is cut off to form an aperture.

Figure 4F:
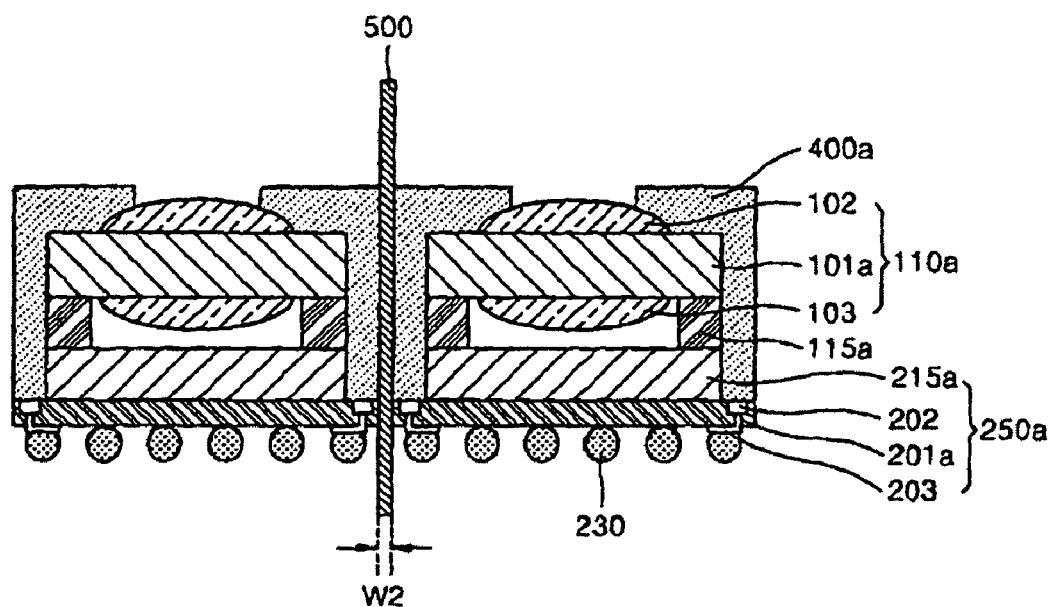

Referring to FIG. 4F, a second cutting process may be performed on the first material 400 and the image sensor chip 201a at the interface between the adjacent lens units 110a so as to form individual image sensor CSPs 250a. In this case, the second cutting process may be performed on the interface between adjacent ground pads 202. Here, the adjacent ground pads 202 may refer to ground pads 202 of adjacent arrays.

The second cutting process may be performed on the first material 400 and the image sensor chip 201a using a second cutting blade 500 with a second width W2 smaller than the first width W1 of FIG. 4C. Alternatively, the second cutting process may be performed using a laser or a water-jet, which has the second width W2 smaller than the first width W1. The first material 400 may be cut using the second cutting process, thereby forming an individual housing 400a.

According to the above-described method, various disadvantages that result from the housing's sensitivity to dimensional variance can be solved. Also, since it is unnecessary to perform an epoxy process for mounting the housing onto an image sensor chip, the entire process of fabricating a camera module can be simplified.

According to embodiments of the present inventive concept as explained thus far, failures due to the housing's sensitivity to dimensional variation and the housing's resistance may be reduced, and a camera module capable of effectively shielding EM waves can be fabricated.

While the present inventive concept has been particularly shown and described with reference to exemplary embodiments thereof, it will be understood by one of ordinary skill in the art that variations in form and details may be made therein without departing from the spirit and scope of the present inventive concept as defined by the following claims.

The invention claimed is:

1. A method of fabricating a camera module, the method comprising:
preparing a first wafer including an array of lens units;
preparing a second wafer including an array of image sensor chip-scale packages (CSPs), each image sensor CSP including an image sensor chip corresponding to one of the lens units, wherein a ground pad is formed on the top surface of the image sensor chip and a through via connected to the ground pad is formed through the image sensor chip;
stacking the first wafer on the second wafer;
cutting the first wafer and the second wafer to form a trench exposing the ground pad on the top surface of the image sensor chip at an interface between adjacent lens units;
filling the trench with a first material used for forming a camera module housing, wherein the first material includes a conductive material that contacts the ground pad, such that the camera module housing contacts the ground pad, and wherein the filling of the trench with the first material comprises filling the trench with the first material to an outer portion of the lens unit by which light is cut off so as to form an aperture in the lens unit; and
cutting the first material and the image sensor chip at the interface between the adjacent lens units.

2. The method of claim 1, wherein the ground pad connects to a solder ball on the image sensor chip using the through via.

3. The method of claim 1, wherein the cutting of the first material and the image sensor chip is performed on an interface between adjacent ground pads.

4. The method of claim 1, wherein the first material extends from the trench to cover part of top surfaces of each of the lens units while leaving a part of the top surface of each of the lens units uncovered so as to form the aperture in each lens unit.

5. The method of claim 1, wherein the first material includes a light blocking material.

6. The method of claim 1, wherein the first material includes a conductive material and a light blocking material.

7. The method of claim 1, wherein the filling of the trench with the first material is performed using one of a dispensing process and a molding process.

8. The method of claim 1, wherein the filling of the trench with the first material is performed using one of a chemical vapor deposition process and a physical vapor deposition process.

9. The method of claim 1, wherein the cutting of the first and second wafers is performed using a first cutting blade with a first width such that the trench is formed to have the first width.

10. The method of claim 9, wherein the cutting of the first material and the image sensor chip is performed using a second cutting blade with a second width smaller than the first width.

11. The method of claim 9, wherein the cutting of the first material and the image sensor chip is performed using a laser or a water-jet, which has a second width smaller than the first width.

12. The method of claim 1, further comprising forming a solder ball on a bottom surface of the image sensor chip.

13. The method of claim 1, further comprising cutting the first material and the image sensor chip at the interface between the adjacent lens units in a single process, such that a surface of the camera module including a lateral surface of the first material and an adjacent lateral surface for the image sensor chip is continuously formed.

14. The method of claim 1, wherein the first wafer comprises a semiconductor substrate on which the lens units of the array of lens units are mounted.

15. A method of fabricating a camera module, the method comprising:

preparing a first wafer substrate including an array of lens units mounted thereon, each lens unit of the array disposed a predetermined distance in a horizontal direction from an adjacent lens unit of the array;

preparing a second wafer substrate including an array of image sensor chip-scale packages (CSPs) mounted thereon, each image sensor CSP including an image sensor chip corresponding to one of the lens units, wherein a ground pad is formed on the top surface of the image sensor chip and a through via connected to the ground pad is formed through the image sensor chip;

stacking the first wafer on the second wafer;

cutting the first wafer and the second wafer to form a trench exposing the ground pad on the top surface of the image sensor chip at an interface between adjacent lens units;

filling the trench with a first material used for forming a camera module housing, wherein the first material includes a conductive material that contacts the ground pad, such that the camera module housing contacts the ground pad; and cutting the first material and the image sensor chip at the interface between the adjacent lens units.

16. The method of claim 15, wherein the first material extends from the trench to cover part of top surfaces of each of the lens units while leaving a part of the top surface of each of the lens units uncovered so as to form an aperture in each lens unit.

17. The method of claim 15, further comprising cutting the first material and the image sensor chip at the interface between the adjacent lens units in a single process, such that a surface of the camera module including a lateral surface of the first material and an adjacent lateral surface for the image sensor chip is continuously formed.

18. The method of claim 15, wherein the ground pad connects to a solder ball on the image sensor chip using the through via.

19. The method of claim 15, wherein the first material includes a light blocking material.

20. A method of fabricating a camera module, the method comprising:

preparing a first wafer substrate including an array of lens units mounted thereon, each lens unit of the array disposed a predetermined distance in a horizontal direction from an adjacent lens unit of the array;

preparing a second wafer substrate including an array of image sensor chip-scale packages (CSPs) mounted thereon, each image sensor CSP including an image sensor chip corresponding to one of the lens units, wherein a ground pad is formed on the top surface of the image sensor chip and a through via connected to the ground pad is formed through the image sensor chip;

stacking the first wafer on the second wafer;

cutting the first wafer and the second wafer at an interface between adjacent lens units to form trenches exposing the ground pad on the top surface of each image sensor chip;

filling each trench with a first material used for forming a camera module housing, wherein the first material includes a conductive material that contacts the ground pad, such that the camera module housing contacts the ground pad, and wherein the camera module housing formed of the first material extends to a top surface of the corresponding lens unit to form an aperture; and cutting the first material and the image sensor chip in a single process at the interface between the adjacent lens units to form the camera module.

\* \* \* \* \*